(12) United States Patent
Zhang et al.

(10) Patent No.: US 9,780,101 B1
(45) Date of Patent: Oct. 3, 2017

(54) FLASH CELL STRUCTURE AND METHOD OF FABRICATING THE SAME

(71) Applicant: UNITED MICROELECTRONICS CORP., Hsin-Chu (TW)

(72) Inventors: Sheng Zhang, Singapore (SG); Wenbo Ding, Singapore (SG); Xiaofei Han, Singapore (SG); Chien-Kee Pang, Singapore (SG); Yu-Yang Chen, Singapore (SG); Jubao Zhang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/361,065

(22) Filed: Nov. 24, 2016

(51) Int. Cl.
| | | |
|---|---|---|
| *H01L 21/8238* | (2006.01) | |
| *H01L 21/336* | (2006.01) | |
| *H01L 29/788* | (2006.01) | |
| *H01L 27/11521* | (2017.01) | |
| *H01L 29/66* | (2006.01) | |

(52) U.S. Cl.
CPC .. *H01L 27/11521* (2013.01); *H01L 29/66825* (2013.01); *H01L 29/788* (2013.01)

(58) Field of Classification Search
CPC ......... H01L 29/42324; H01L 29/66825; H01L 29/788; H01L 27/11517; H01L 27/1156

USPC ................. 438/201, 211, 257, 593
See application file for complete search history.

(56) References Cited

U.S. PATENT DOCUMENTS

| | | | |
|---|---|---|---|
| 7,531,438 B2 | 5/2009 | Chou | |
| 9,455,322 B1 | 9/2016 | Chiu | |
| 2014/0151782 A1* | 6/2014 | Tsair | H01L 29/7881 257/320 |
| 2015/0263123 A1* | 9/2015 | Cheng | H01L 29/66825 257/319 |

* cited by examiner

*Primary Examiner* — Hsien Ming Lee
(74) *Attorney, Agent, or Firm* — Winston Hsu

(57) ABSTRACT

The present invention provides a flash cell structure and a method of fabricating the same. The flash cell structure includes a semiconductor substrate, a stacked gate structure disposed on the semiconductor substrate, a first doped region disposed in the semiconductor substrate at a side of the stacked gate structure, a first dielectric layer, a second dielectric layer, and an erase gate. The stacked gate structure includes a floating gate insulated from the semiconductor substrate and a control gate disposed on the floating gate and insulated from the floating gate. The first dielectric layer is disposed on a sidewall of the floating gate. The second dielectric layer is disposed on the first doped region. A thickness of the first dielectric layer is less than a thickness of the second dielectric layer.

18 Claims, 11 Drawing Sheets

FLASH CELL STRUCTURE AND METHOD OF FABRICATING THE SAME

BACKGROUND OF THE INVENTION

1. Field of the Invention

The present invention relates to a flash cell structure and a method of fabricating the same, and more particularly to a flash cell structure having a thickness of a dielectric layer between an erase gate and a floating gate less than a thickness of the dielectric layer between the erase gate and a source and a method of fabricating the same.

2. Description of the Prior Art

Communication of mass information is a feature of modern life. Memory devices that access information are essential for managing such information efficiently. Flash memory, with its advantages of low power consumption, high-speed operation, being readable/writable, non-volatile, and requiring no mechanical operations, has been widely applied to personal computers and electronic apparatus. Operations of data writing, reading, and erasing can be performed repeatedly on a non-volatile memory device and the data stored therein will not be lost even when a power supply is turned off.

Flash memory includes a plurality of flash cells, wherein each flash cell includes a MOS (Metal-Oxide-Semiconductor) transistor. Each MOS transistor includes a stacked gate structure having a floating gate and a control gate sequentially stacked on a semiconductor substrate. The floating gate and the control gate are isolated by an insulating layer, and the floating gate and the semiconductor substrate are isolated by a tunneling oxide (this is known as a stacked gate flash memory). A source region and a drain region are disposed in the semiconductor substrate at two sides of the stacked gate structure. In order to be erasable, each flash cell further includes an erase gate disposed beside the floating gate. For minimizing the size of the flash cell, the erase gate is usually disposed on the source region. An inter poly oxide is formed between the erase gate and the source region and between the erase gate and the floating gate to not only isolate the erase gate from the source region but also isolate the erase gate and the floating gate. Since that, the thickness of the inter poly oxide between the erase gate and the floating gate and the thickness of the inter poly oxide between the erase gate and the source region are the same. However, there is a tradeoff in the design of the thickness of the inter poly oxide in the conventional flash cell structure. That is, the erase operation of the flash cell structure is easily failed when the thickness of the inter poly oxide between erase gate and the floating gate is too thick, and the breakdown of the inter poly oxide between the erase gate and the source region is easily generated when the thickness of the inter poly oxide between the erase gate and the source region is too thin. Accordingly, to design a new flash cell structure to overcome this issue is an objective in this field.

SUMMARY OF THE INVENTION

An objective of the present invention is to provide a flash cell structure and a method of fabricating the same to have the total thickness of the first dielectric layer and the third dielectric layer between the erase gate and the floating gate being less than the total thickness of the second dielectric layer and the third dielectric layer between the erase gate and the first doped region.

According to an exemplary embodiment, a flash cell structure is provided. The flash cell structure includes a semiconductor substrate, a stacked gate structure, a first doped region, a first dielectric layer, a second dielectric layer, and an erase gate. The stacked gate structure is disposed on the semiconductor substrate, and includes a floating gate and a control gate. The floating gate is insulated from the semiconductor substrate. The control gate is disposed on the floating gate and insulated from the floating gate. The first doped region is disposed in the semiconductor substrate at a side of the stacked gate structure. The first dielectric layer is disposed on a sidewall of the floating gate. The second dielectric layer is disposed on the first doped region. The erase gate is disposed on the first dielectric layer and the second dielectric layer, wherein a thickness of the first dielectric layer between the erase gate and the floating gate is less than a thickness of the second dielectric layer between the erase gate and the first doped region.

According to another exemplary embodiment, a method of fabricating a flash cell structure is provided. First, a stacked gate structure is formed on a semiconductor substrate. The stacked gate structure includes a floating gate and a control gate. The floating gate is insulated from the semiconductor substrate. The control gate is disposed on the floating gate and insulated from the floating gate. Next, a first doped region is formed in the semiconductor substrate at a side of the stacked gate structure, a first dielectric layer is formed on a sidewall of the floating gate, and a second dielectric layer is formed on the first doped region, wherein a thickness of the first dielectric layer is less than a thickness of the second dielectric layer. Then, a third dielectric layer is formed to cover the stacked gate structure, the first dielectric layer and the second dielectric layer. Thereafter, an erase gate is formed on the third dielectric layer at the side of the stacked gate structure.

In the present invention, the total thickness of the first dielectric layer and the third dielectric layer between the erase gate and the floating gate is less than the total thickness of the second dielectric layer and the third dielectric layer between the erase gate and the first doped region, so that when the flash cell structure is in the erase operation, elections in the floating gate can easily tunnel through the first dielectric layer and the third dielectric layer between the erase gate and the floating gate without resulting in the breakdown of the second dielectric layer and the third dielectric layer between the erase gate and the first doped region.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details, as well as accompanying drawings, are given to provide a thorough understanding of the invention. It will, however, be apparent to one skilled in the art that the invention may be practiced without these specific details.

In general, the present invention is directed to various methods of fabricating a flash cell structure and a device including the flash cell structure. Although the present invention will be disclosed in the context of the fabrication of an illustrative flash cell structure, those skilled in the art will understand after a complete reading of the present application that the present invention is not so limited. Moreover, the present invention may be employed using a variety of technologies, e.g., NMOS, PMOS, CMOS, etc., and it may be employed with a variety of different type devices, e.g., memory devices, logic devices, etc.

Figure 1:
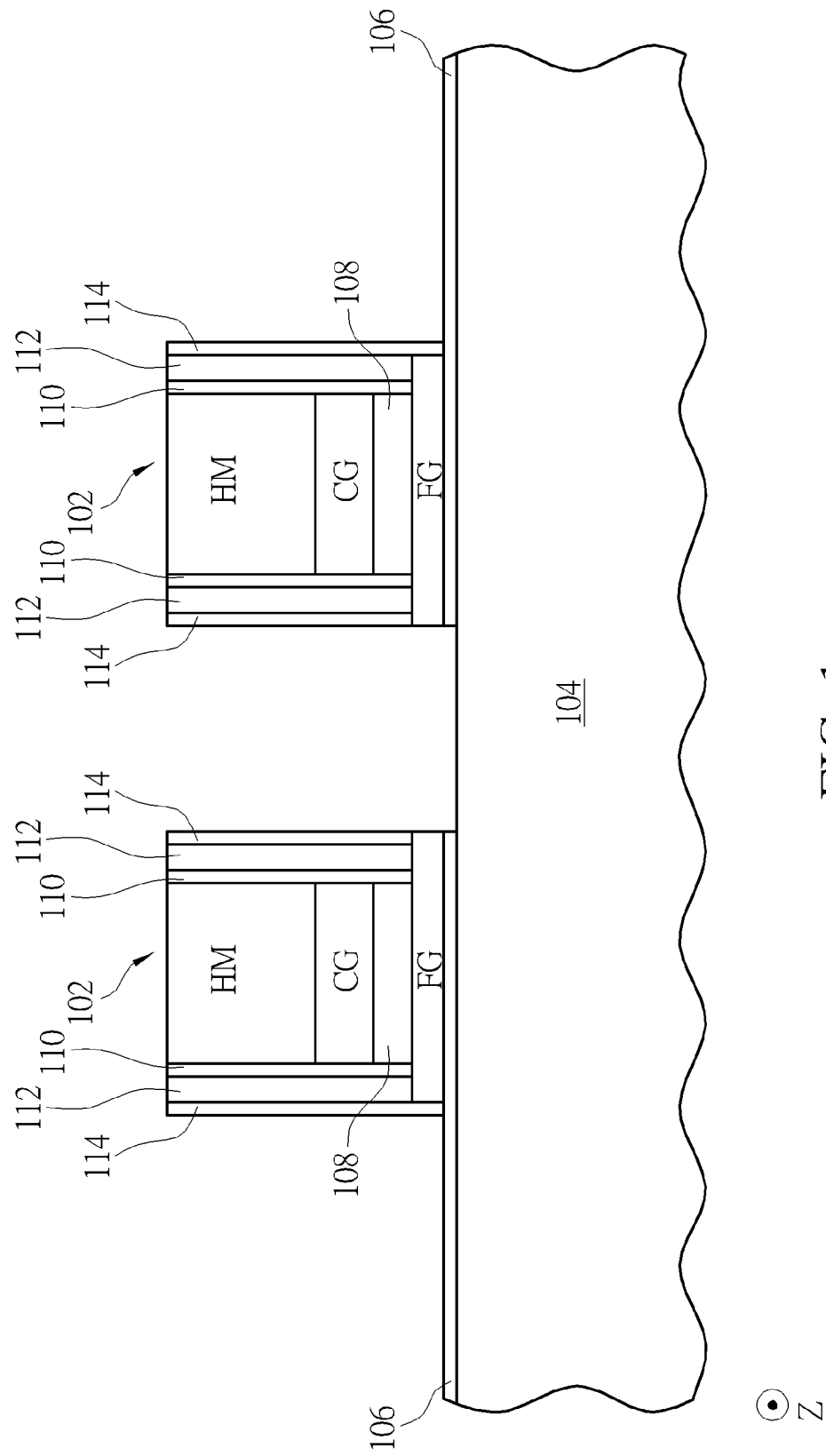
FIGS. 1-6 are schematic diagrams illustrating a method of fabricating a flash cell structure according to a first embodiment of the present invention.
Figure 4:
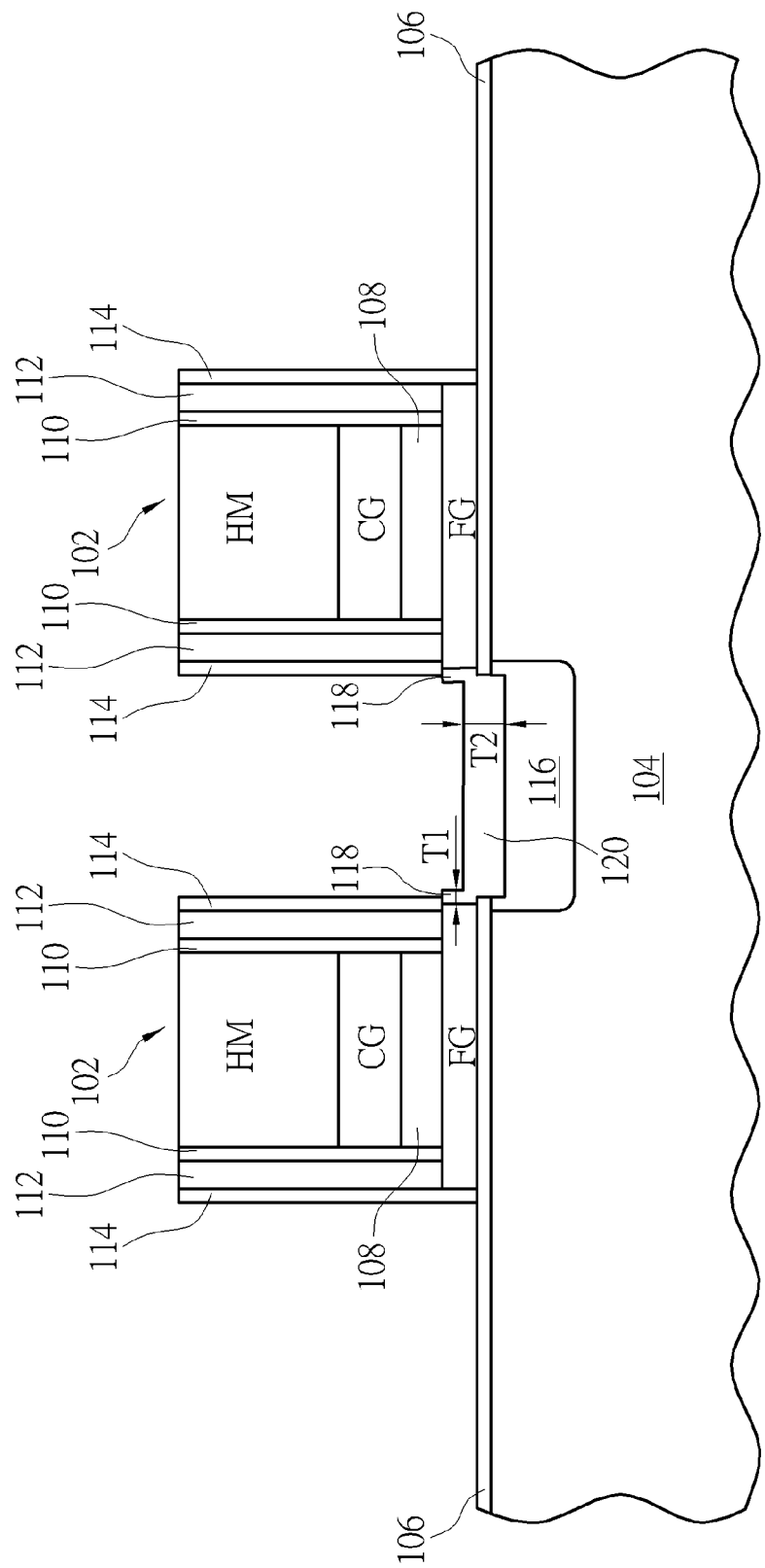
Figure 5:
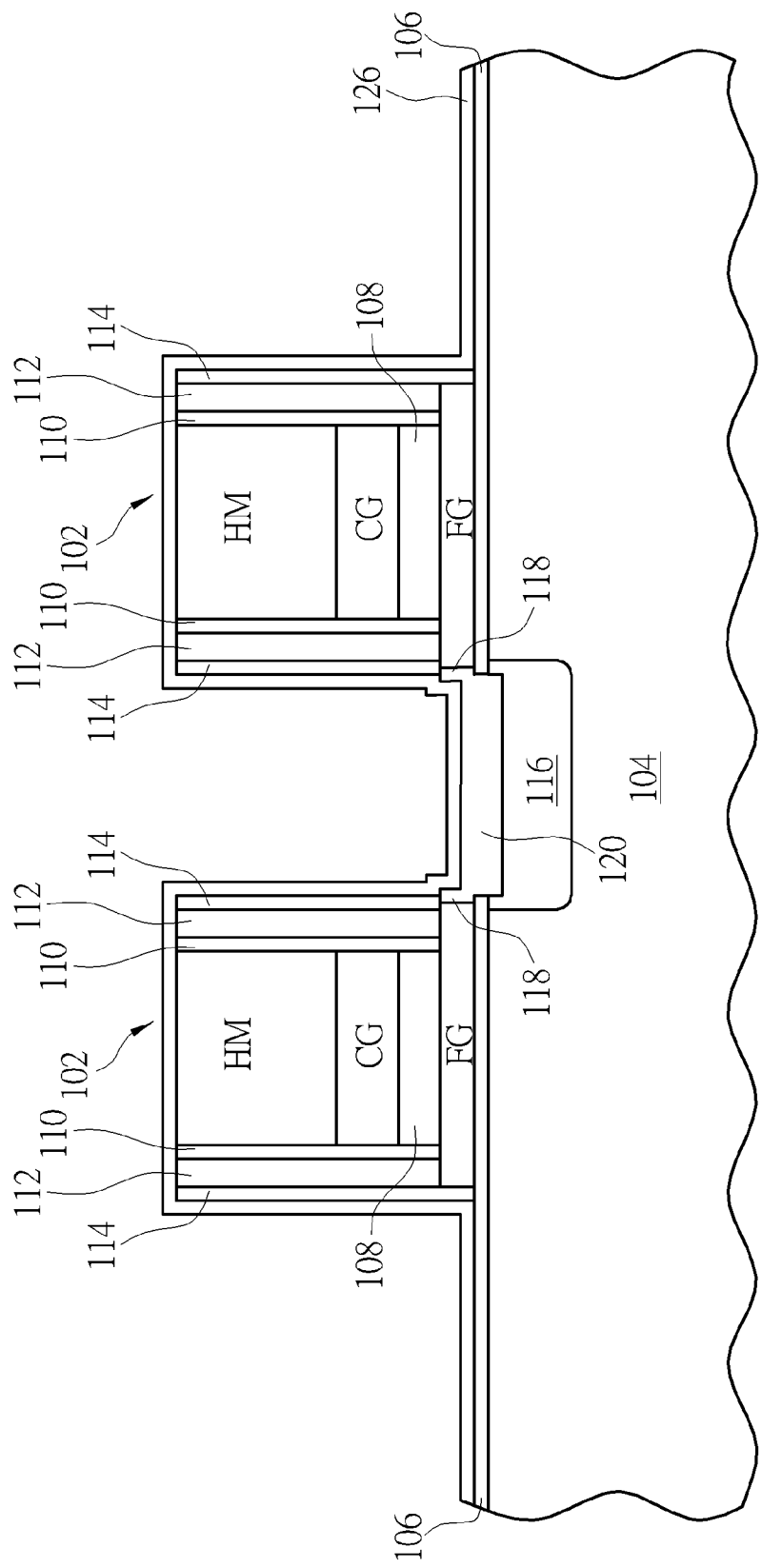
Figure 6:
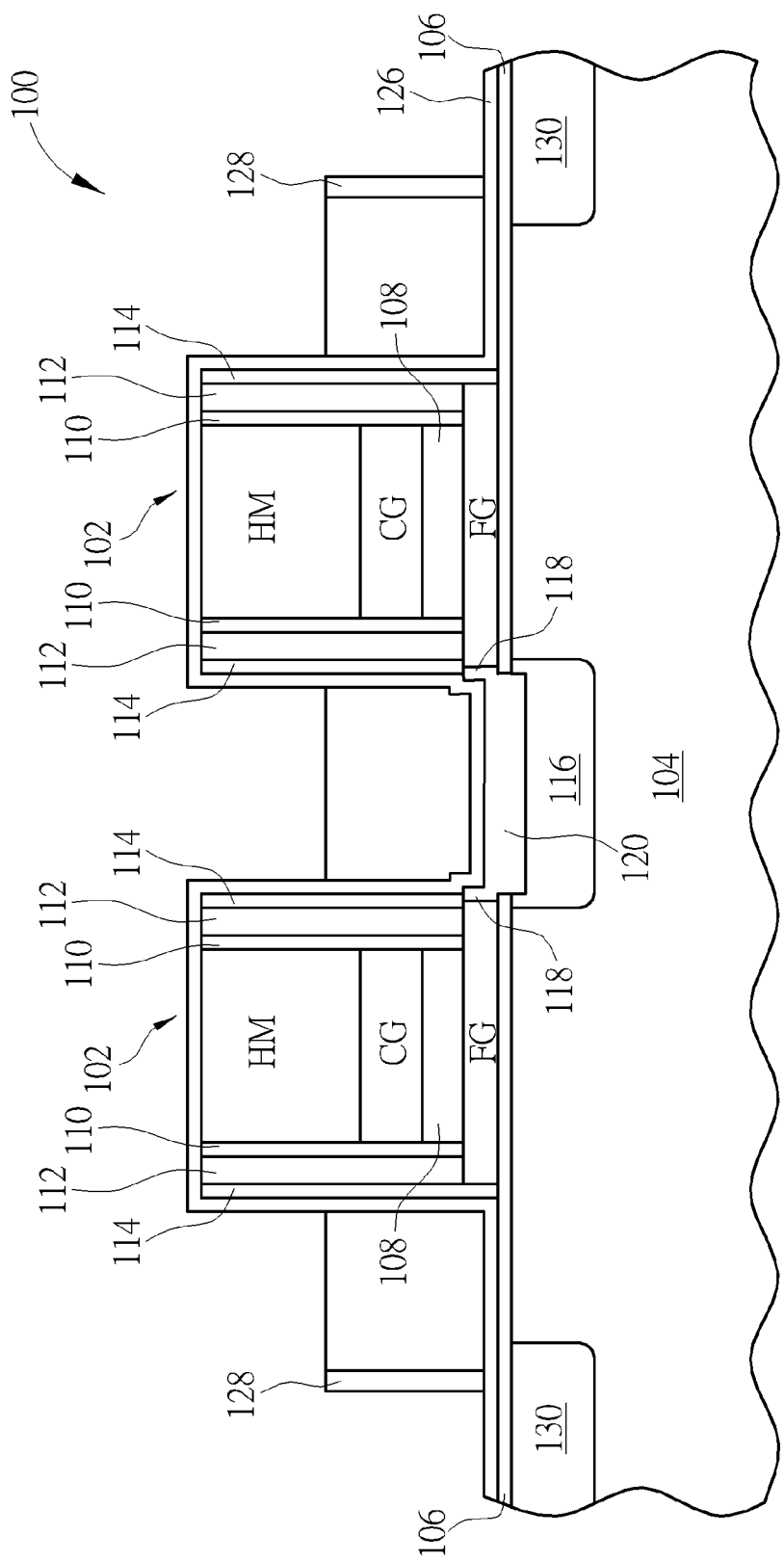

Refer to FIGS. 1-6, which are schematic diagrams illustrating a method of fabricating a flash cell structure according to a first embodiment of the present invention, wherein FIG. 6 schematically illustrates the flash cell structure according to the first embodiment of the present invention. The method of fabricating the flash cell structure of this embodiment is provided in the following description. As shown in FIG. 1, a stacked gate structure 102 is first formed on a semiconductor substrate 104. The stacked gate structure 102 may include a tunneling dielectric layer 106, a floating gate FG, an insulating layer 108, and a control gate CG stacked on the semiconductor substrate 104 in sequence. The tunneling dielectric layer 106 is disposed between the floating gate FG and the semiconductor substrate 104 and insulates the floating gate FG from the semiconductor substrate 104. The insulating layer 108 is disposed between the floating gate FG and the control gate CG and insulates the floating gate FG from the control gate CG. In this embodiment, there are two stacked gate structures 102 formed on the semiconductor substrate 104, and the stacked gate structures 102 are parallel to each other and extend along a direction, such as the direction Z, but the number of the stacked gate structures 102 of the present invention is not limited thereto.

The stacked gate structures 102 may be for example formed by the following steps, but not limited thereto. Firstly, a tunneling dielectric material layer, a floating gate material layer, an insulating material layer, a control gate material layer, a hard mask material layer, and a photoresist layer (not shown in figures) are sequentially and fully deposited on the top surface of the semiconductor substrate 104. The tunneling dielectric material layer may be formed by a thermal oxidation to increase its voltage endurance ability, thereby including silicon oxide. The floating gate material layer and the control gate material layer may be for example formed by chemical vapor deposition (CVD) processes and formed of polysilicon or amorphous silicon, but not limited thereto. Also, the floating gate material layer may further be ion implanted with dopants with a first conductivity type or may remain undoped, and the control gate material layer may be further ion implanted with dopants with the first conductivity type. In this embodiment, the first conductivity type is n-type, and the dopants with the first conductivity type may include for example arsenic, phosphorus or antimony, but not limited thereto. The insulating material layer may be formed of one or more of a variety of dielectric materials, such as silicon dioxide ($SiO_2$), silicon nitride ($Si_3N_4$), another oxide (e.g., Ge oxide), an oxynitride (e.g., silicon oxynitride), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like or a multilayer, such as an oxide/nitride/oxide layer. The hard mask material layer may be for example formed of silicon nitride, but not limited thereto.

Subsequently, a photolithography process is performed to pattern the photoresist layer to form a photoresist pattern that defines the pattern of the control gates CG and followed by performing at least one etching process using the photoresist pattern as a mask to sequentially etch the hard mask material layer, the control gate material layer and the insulating material layer so as to respectively form two hard masks HM, the control gates CG and the insulating layers 108, in which the hard mask material layer, the control gate material layer and the insulating material layer may be etched in one etching process or in different etching process with different etchants. After that, two first oxide spacers 110 are respectively formed on an inner sidewall and an outer sidewall of each hard mask HM, each control gate CG and each insulating layer 108, and a nitride spacer 112 is formed on each first oxide spacer 110 respectively, in which the inner sidewalls is the sidewalls face each other. A part of the floating gate material layer between the control gates CG is then covered with another photoresist pattern, and an exposed part of the floating gate material layer that is not covered by the photoresist pattern, the hard masks HM, the first oxide spacers 110 and the nitride spacers 112 are removed, in which the tunneling dielectric material layer under the exposed part of the floating gate material layer is not removed. That is, the floating gate material layer at outer sides of the control gates CG is removed. The photoresist pattern is removed and followed by forming a second oxide spacer 114 respectively on each nitride spacer 112. Next, another photoresist pattern is formed on the hard masks HM and extends to cover the tunneling dielectric material layer at outer sides of the control gates CG, so that the floating gate material layer between the second oxide spacers 114 that are disposed between the control gates CG is exposed. The exposed floating gate material layer and the tunneling dielectric material layer disposed thereunder are removed to form the floating gates FG and the tunneling dielectric layers 106 by performing at least one etching process, thereby forming the stacked gate structures 102. Since each floating gate FG is formed by using the first oxide spacers 110, the nitride spacers 112, the second oxide spacers 114 at outer sidewalls of the control gates and the hard masks HM as the mask, a width of each formed floating gate FG is greater than a width of each control gate CG.

In this embodiment, the semiconductor substrate 104 may include a silicon substrate, a substrate including silicon, an epitaxial silicon substrate, a silicon germanium substrate, a silicon carbide substrate or a silicon-on-insulator (SOI) substrate, but not limited thereto. For instance, the semiconductor substrate 104 may be doped with dopants with a second conductivity type complementing the first conductivity type. The second conductivity type of this embodiment is p-type, and the dopants with the second conductivity type may include for example boron, boron difluoride, but not limited thereto. In another embodiment, a p-type well may be formed in the semiconductor substrate 104 before the stacked gate structures 102 are formed, and the semiconductor substrate 104 may be either doped with p-type dopants or n-type dopants.

Figure 2:
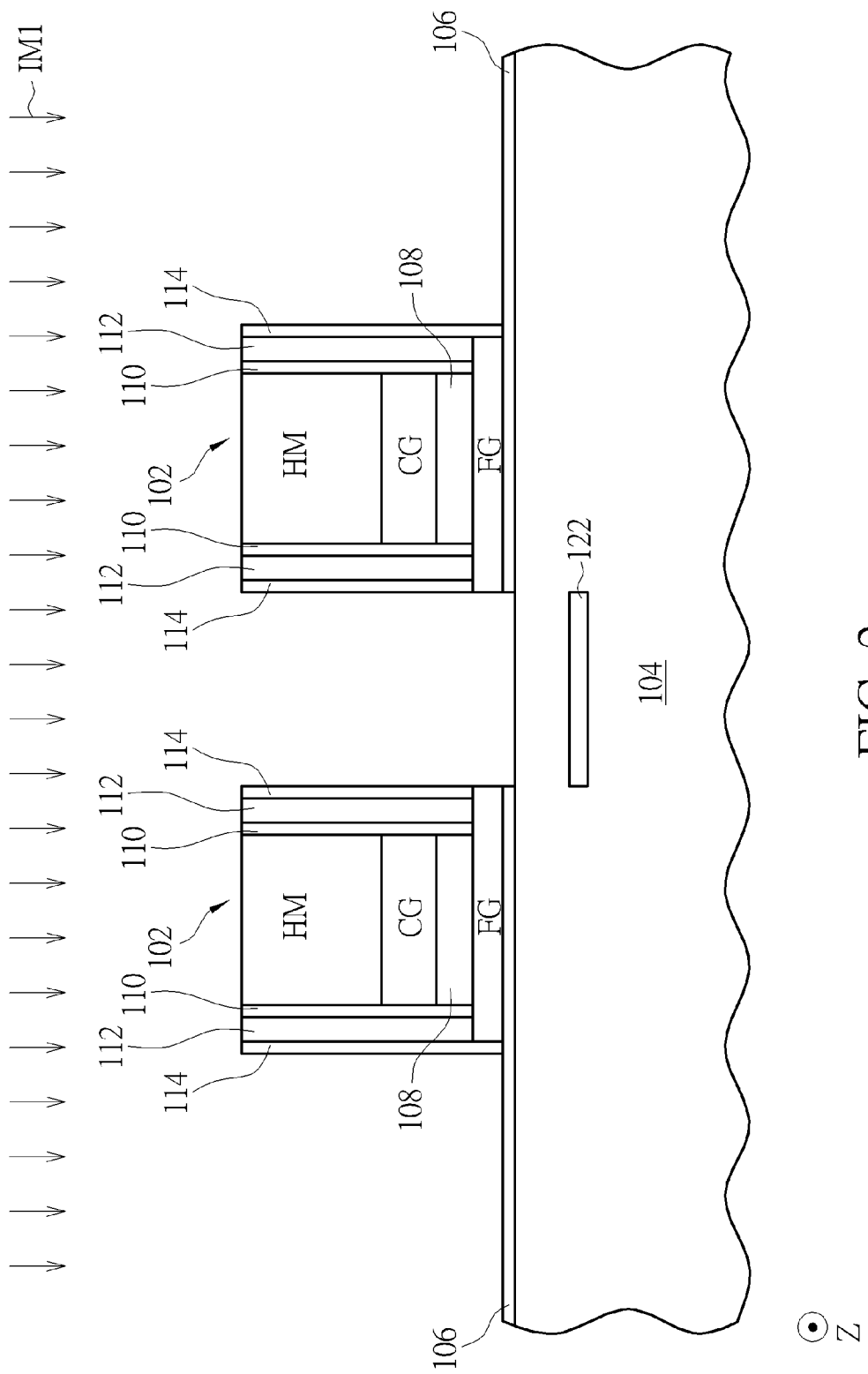

After the stacked gate structures 102 are formed, a first doped region 116 is formed in the semiconductor substrate 104 at a side of the stacked gate structure 102, a first dielectric layer 118 is formed on each inner sidewall of each floating gate FG, and a second dielectric layer 120 is formed on the first doped region 116. The first doped region 116 may have n type while the semiconductor substrate 104 has p type, but the present invention is not limited thereto, and the conductivity type of first doped region 116 and the conductivity type of the semiconductor substrate 104 may be switched. The formation of the first doped region 116, the first dielectric layers 118 and the second dielectric layer 120 are specifically disclosed in the following description. As shown in FIG. 2, a first implantation process IM1 is performed to implant first dopants 122 into the semiconductor substrate 104. In this embodiment, depending on the conductivity type of the first doped region 116, the first dopants 122 is n-type, and may include arsenic, phosphorus or antimony, but not limited thereto. A first doping concentration of the first implantation process IM1 is about $5^{14}$ atoms/$\mu m^3$, and a first energy of the first implantation process is about 60 keV.

Figure 3:
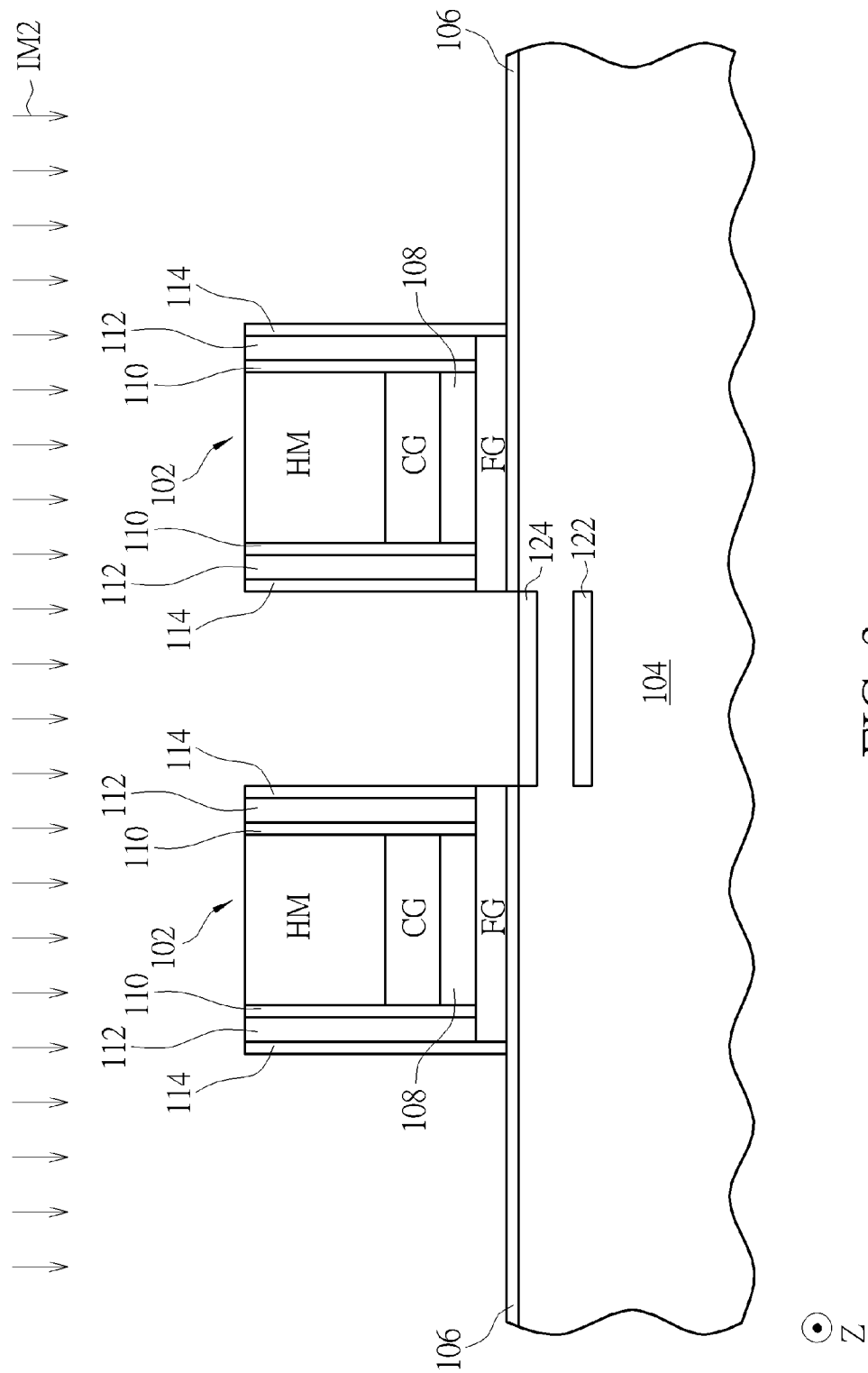

As shown in FIG. 3, after the first implantation process IM1, a second implantation process IM2 is performed to implant second dopants 124 into the semiconductor substrate 104 at a second doping concentration and a second energy. In this embodiment, the second dopants 124 may be the same as the first dopants 122. Also, the second doping concentration of the second implantation process IM2 is larger than the first doping concentration, and the second energy of the second implantation process IM2 is lower than the first energy. For example, the second doping concentration is about $1.8^{15}$ atoms/$\mu m^3$, and the second energy is about 20 keV. In another variant embodiment, the second implantation process IM2 may be performed before the first implantation process IM1. It should be noted that since the second energy is lower than the first energy, the second dopants 124 implanted by the second implantation process IM2 may be near the top surface of the semiconductor substrate 104. Also, since the second doping concentration is larger than the first doping concentration, the doping concentration of the dopants near the top surface of the semiconductor substrate 104 is larger than that of the dopants far away from the top surface of the semiconductor substrate 104.

Figure 7:
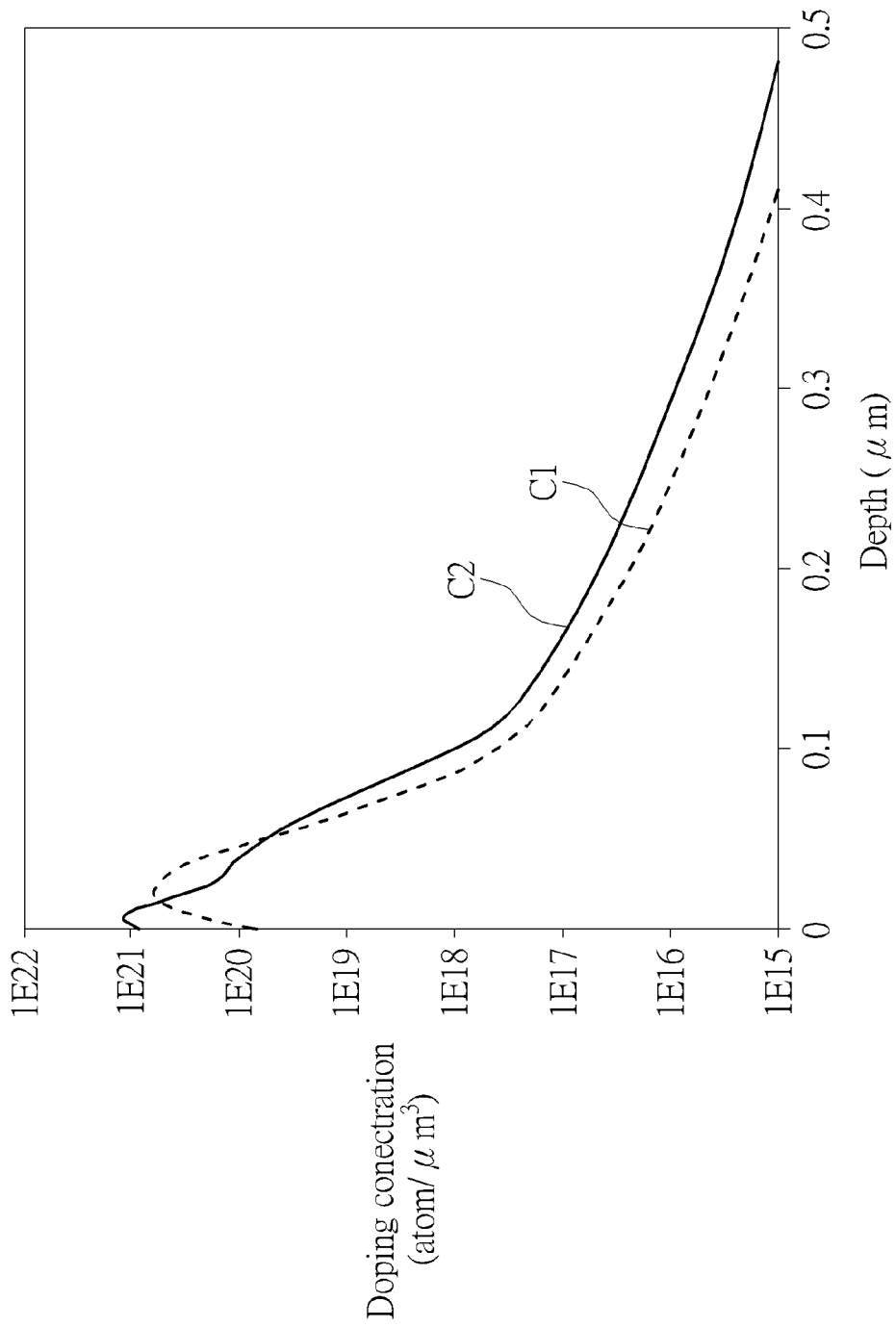
FIG. 7 shows a relation between the doping concentration and the depth of the first doped region of this embodiment and a relation between the doping concentration and the depth of the first doped region formed by performing only one implantation process.

As shown in FIG. 4, a drive-in process may be then performed to diffuse the first dopants 122 and the second dopants 124 so as to form the first doped region 116. Refer to FIG. 7, which shows a relation between the doping concentration and the depth of the first doped region of this embodiment and a relation between the doping concentration and the depth of the first doped region formed by performing only one implantation process. As shown in FIG. 7, a curve C1 represents a relation between the doping concentration and the depth of the first doped region formed by performing only one implantation process, and a curve C2 represents a relation between the doping concentration and the depth of the first doped region of this embodiment. As compared with performing only one implantation process to form the first doped region 116, two implantation processes performed in this embodiment can increase the doping concentration of the dopants near the top surface of the semiconductor substrate 104 under the condition without largely changing the total doping concentration of the formed first doped region 116 which represents the resistance of the first doped region 116. For example, the doping concentration of the first doped region at a depth of less than 100 nm is greater than $7^{20}$ atoms/$\mu m^3$.

After the formation of the first doped region 116, a pretreatment process is subsequently performed to form the first dielectric layers 118 respectively on the exposed sidewalls of the floating gates FG (that are the inner sidewalls of the floating gates FG) and the second dielectric layer 120 on the exposed top surface of the semiconductor substrate 104. Specifically, the pretreatment process is performed by introducing nitrogen oxide, such as nitric oxide or nitrous oxide, to treat the inner sidewalls of the floating gates FG and the top surface of the semiconductor substrate 104 in the first doped region 116. Accordingly, the exposed floating gate FG and the exposed semiconductor substrate 104 including silicon can react with nitrogen oxide to form the first dielectric layers 118 and the second dielectric layer 120 that include silicon oxide. It should be noted that the doping concentration of the dopants in the first doped region 116 near the top surface of the semiconductor surface 104 is larger than the doping concentration of the dopants in the floating gates FG, so that the growth rate of the first dielectric layers 118 on the floating gates FG is slower than the growth rate of the second dielectric layer 120 on the semiconductor substrate 104, thereby resulting in the thickness T1 of each first dielectric layer 118 being less than the thickness T2 of the second dielectric layer 120. Because of the snow plow effect, the n-type dopants have higher solubility in silicon than in silicon oxide, so when the semiconductor substrate 104 reacts with the nitrogen oxide to grow silicon oxide, the n-type dopants near the top surface will move into the deeper semiconductor substrate 104. In this embodiment, since the thickness T2 of the second dielectric layer 120 is larger than a thickness of the tunneling dielectric layer 106, the second dielectric layer 120 can be in contact with each first dielectric layer 118, and the first dielectric layers 118 and the second dielectric layer 120 are formed of a continuous dielectric layer, in which each first dielectric layer 118 and the second dielectric layer 120 are respectively a thinner part and a thicker part of the continuous dielectric layer, but the present invention is not so limited. In another embodiment, if the tunneling dielectric layer 106 has a thickness larger than the second dielectric layer 120, the second dielectric layer 120 will not be in contact with the first dielectric layer 118. In another embodiment, the pretreatment process may be performed in a high temperature the same as the drive-in process, so that the first doped region 116 may be formed with the first dielectric layers 118 and the second dielectric layer 120 in the pretreatment process, and the drive-in process may be neglected. In another embodiment, the pretreatment process may be performed before the drive-in process and after the first and second implantation processes.

In this embodiment, the temperature of the pretreatment process may be about 300° C. to 400° C. In another embodiment, the temperature of the pretreatment process may be about 700° C. to 1000° C. so as to enhance the reaction between nitrogen oxide and silicon and speed up the diffusion of the first dopants 122 and the second dopants 124. In another embodiment, a thermal oxidation process may be performed after or before the pretreatment process to increase the thicknesses of both the first dielectric layer 118 and the second dielectric layer 120.

As shown in FIG. 5, a third dielectric layer 126 may be selectively formed to cover the tunneling dielectric layer 106, the stacked gate structures 102, the first dielectric layers 118 and the second dielectric layer 120, and the third dielectric layer 126 substantially conformally covers the tunneling dielectric layer 106, the stacked gate structures 102, the first dielectric layers 118 and the second dielectric layer 120. In this embodiment, the third dielectric layer 126 may be formed by a CVD process, so that a thickness of a part of the third dielectric layer 126 formed on the sidewalls of the stacked gate structures 102 may be less than a thickness of another part of the third dielectric layer 126 formed on the second dielectric layer 120. Since that, a total thickness of each first dielectric layer 118 and the third dielectric layer 126 on the inner sidewall of each floating gate FG can be much less than a total thickness of the second dielectric layer 120 and the third dielectric layer 126 on the second dielectric layer 120.

As shown in FIG. 6, after the formation of the third dielectric layer 126, a conductive layer (not shown in the figures) is formed on the third dielectric layer 126 and covers the stacked gate structures 102. An etching back process is performed to remove a part of the conductive layer until a top surface of the conductive layer is lower than a top surface of each hard mask HM or even lower than a top surface of each control gate CG, thereby forming an erase gate EG and two word lines WL. The erase gate EG is disposed on the third dielectric layer 126 at the inner sides of the stacked gate structures 102. The word lines WL are disposed on the third dielectric layer 126 at two outer sides of the stacked gate structures 102. Accordingly, each stacked gate structure 102 is disposed between each word line WL and the erase gate EG. After forming the word lines WL, a part of the tunneling dielectric layer 106 at an outer side of each word line WL may be removed to expose the semiconductor substrate 104 and followed by forming another spacer 128 on the outer side of each word line WL respectively. Thereafter, another implantation process and another drive-in process may be performed to form two second doped regions 130 in the semiconductor substrate 104 respectively beside each word line WL, thereby forming the flash cell structure 100 of this embodiment. The second doped regions 130 are spaced apart from the first doped region 116, and each word line WL and each stacked gate structure are disposed between each second doped region 130 and the first doped region 116. The conductivity type of the second doped region 130 is the same as that of the first doped region 116, such as n type.

It should be noted that since the total thickness of each first dielectric layer 118 and the third dielectric layer 126 on the sidewall of each floating gate FG is less than the total thickness of the second dielectric layer 120 and the third dielectric layer 126 on the second dielectric layer 120, a spacing between the erase gate EG and the floating gate FG is less than a spacing between the erase gate EG and the first doped region 116. Thus, when the flash cell structure 100 is in the erase operation, elections in the floating gate FG can easily tunnel through the first dielectric layer 118 and the third dielectric layer 126 between the erase gate EG and the floating gate FG without resulting in the breakdown of the second dielectric layer 120 and the third dielectric layer 126 between the erase gate EG and the first doped region 116. For example, in the erase operation, the erase gate EG is proved with 11.5 V, the word lines WL are provided with 0 V, the control gate CG is provided with 0 V or lower. The total thickness of each first dielectric layer 118 and the third dielectric layer 126 between the erase gate EG and each floating gate FG may be about 113 angstroms to 119 angstroms, and the total thickness of the second dielectric layer 120 and the third dielectric layer 126 between the erase gate EG and the first doped region 116 may be about 125 angstroms to 131 angstroms. A ratio of the total thickness of the second dielectric layer 120 and the third dielectric layer 126 between the erase gate EG and the first doped region 116 to the total thickness of each first dielectric layer 118 and the third dielectric layer 126 between the erase gate EG and each floating gate FG is substantially from 1.05 to 1.16, which would help the total thickness of each first dielectric layer 118 and the third dielectric layer 126 to comply with the process window when the total thickness of the second dielectric layer 120 and the third dielectric layer 126 is designed to be easily tunneled. The process window means the design range of total thickness of each first dielectric layer 118 and the third dielectric layer 126, such as between 118 angstroms to 132 angstroms.

The flash cell structure and the method of fabricating the flash cell structure of the present invention are not limited to the above-mentioned embodiment. The following description continues to detail the other embodiments or variants, and in order to simplify and show the difference between the other embodiments or variants and the above-mentioned embodiment, the same numerals denote the same components in the following description, and the same parts are not detailed redundantly.

Figure 8:
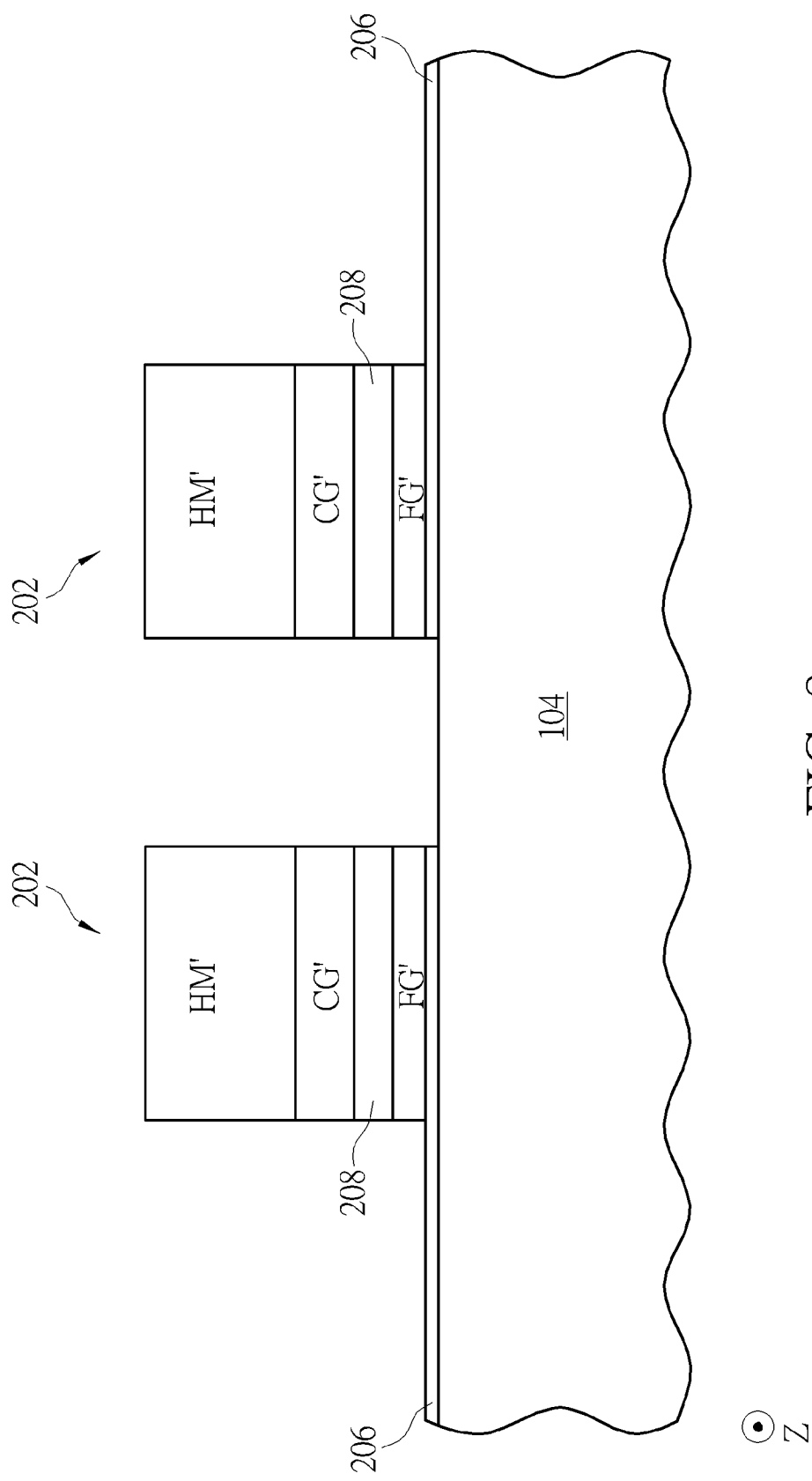
FIGS. 8-11 are schematic diagrams illustrating a method of fabricating a flash cell structure according to a second embodiment of the present invention.
Figure 9:
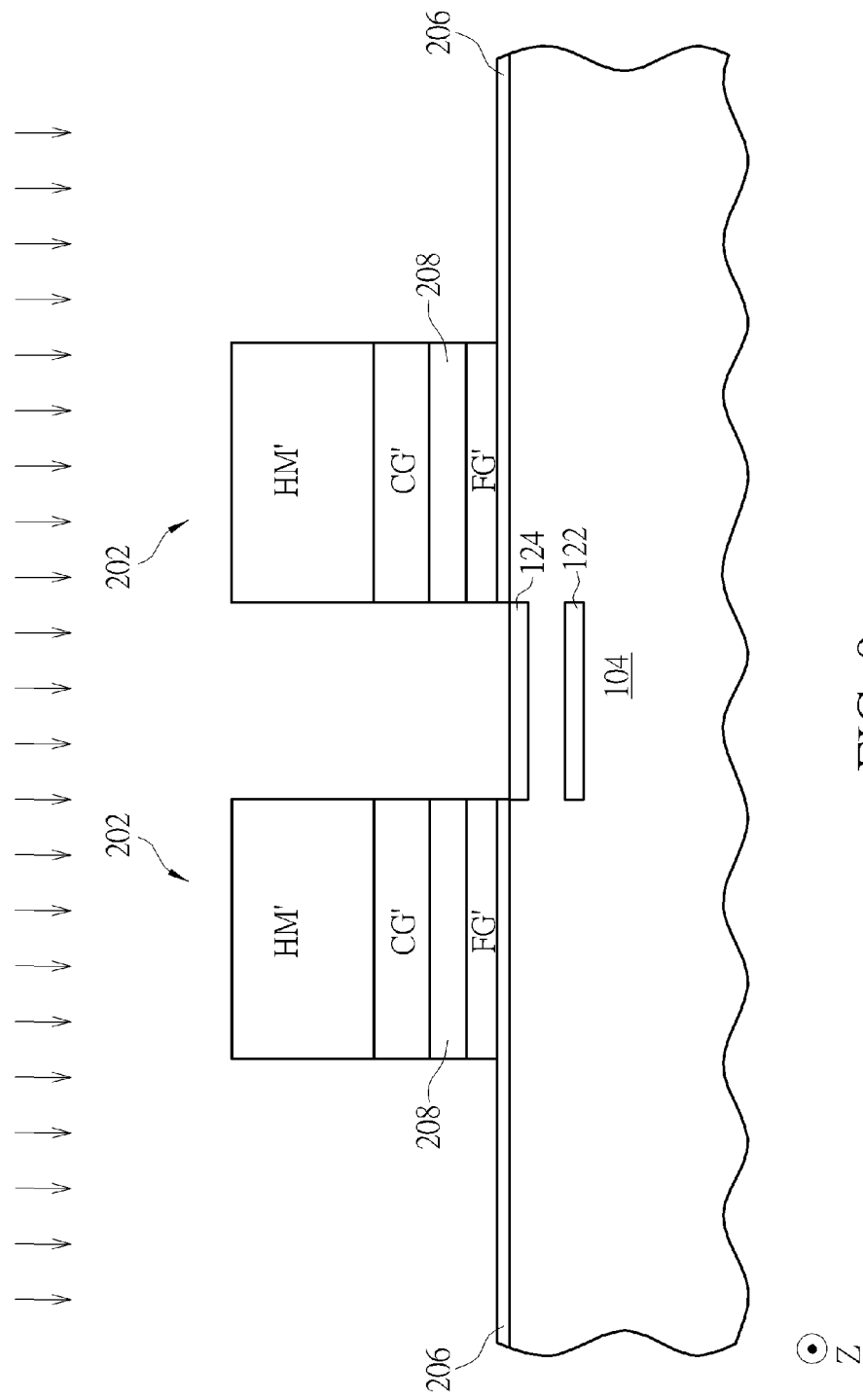
Figure 10:
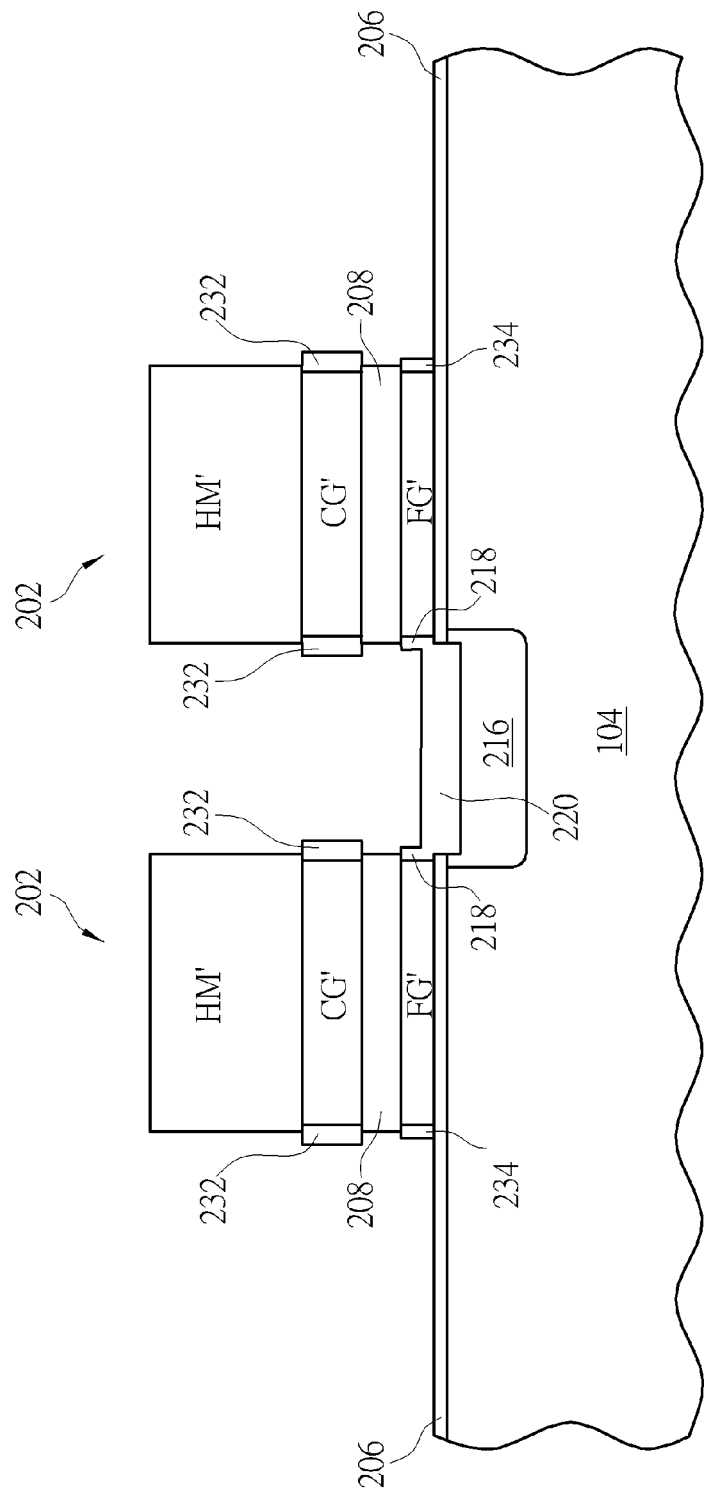
Figure 11:
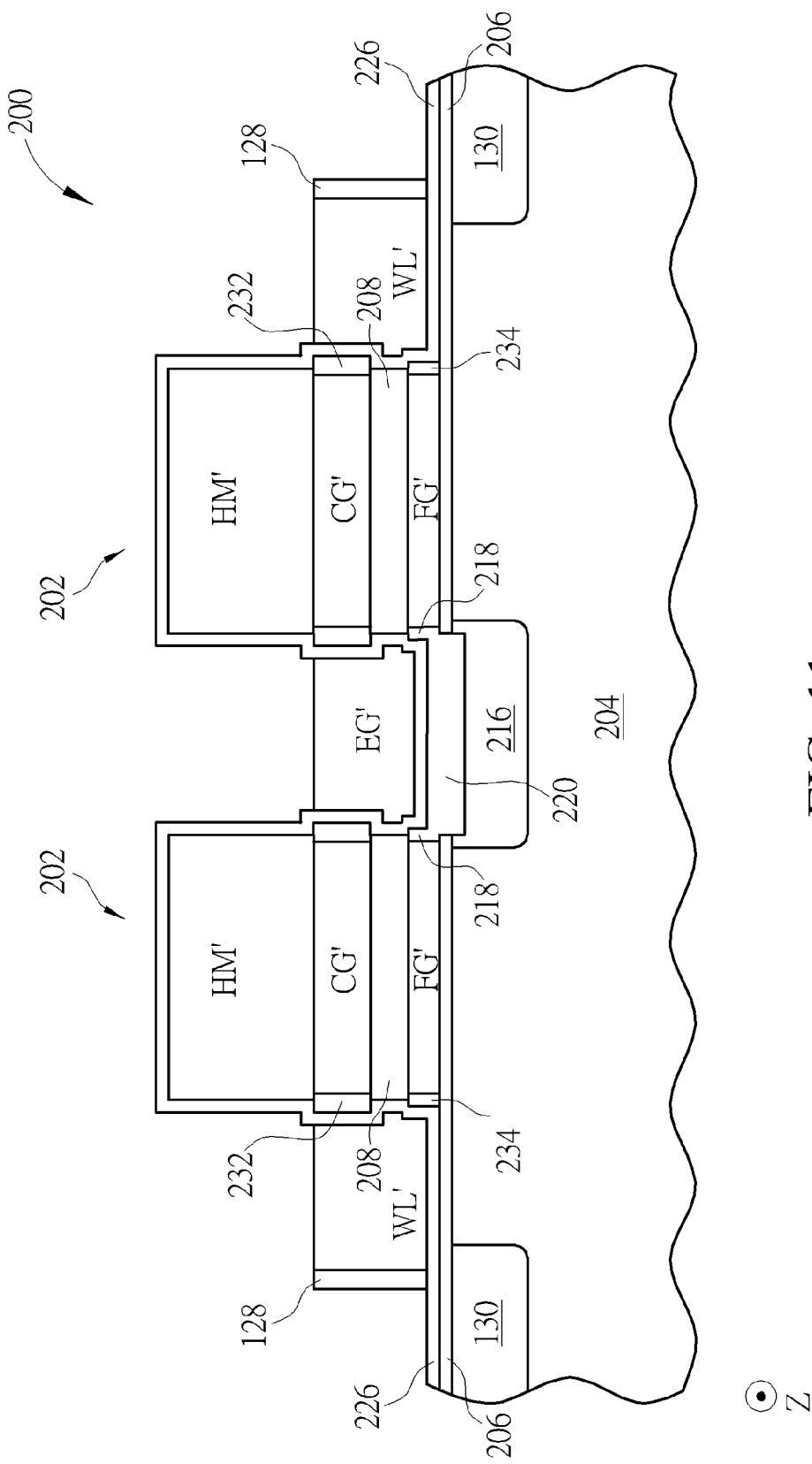

Refer to FIGS. 8-11, which are schematic diagrams illustrating a method of fabricating a flash cell structure according to a second embodiment of the present invention, wherein FIG. 11 schematically illustrates the flash cell structure according to the second embodiment of the present invention. As compared with the first embodiment, the method of fabricating the flash cell structure 200 of this embodiment further etches the floating gate material layer during the at least one etching process using the photoresist pattern as the mask for etching the hard mask material layer, the control gate material layer and the insulating material layer. Specifically, as shown in FIG. 8, in this embodiment, a tunneling dielectric material layer, a floating gate material layer, an insulating material layer, a control gate material layer, a hard mask material layer, and a photoresist layer are also sequentially and fully deposited on the top surface of the semiconductor substrate 104. Thereafter, a photolithography process is performed to form a photoresist pattern and followed by performing at least one etching process using the photoresist pattern as the mask to etch the hard mask material layer, the control gate material layer, the insulating material layer and the floating gate material layer so as to form the hard masks HM', the control gates CG', the insulating layers 208 and the floating gates FG'. Accordingly, the width of each control gate FG' can be the same as that of each floating gate FG'. Following that, the tunneling dielectric material layer disposed between the floating gates FG' is removed to form the tunneling dielectric layer 206, thereby forming the stacked gate structures 202 of this embodiment. In this embodiment, a dopant concentration of each control gate CG' is greater than a dopant concentration of each floating gate FG'.

As shown in FIG. 9, after the stacked gate structures 202 are formed, the first implantation process and the second implantation process are sequentially performed to implant the first dopants 122 and the second dopants 124 into the semiconductor substrate 104. The first implantation process and the second process of this embodiment is the same as the first embodiment, and will not be detailed redundantly.

As shown in FIG. 10, a drive-in process is then performed to form the first doped region 216. Besides the first dielectric layers 218 and the second dielectric layer 220, the pretreatment process also forms a fourth dielectric layer 232 on each exposed sidewall of each control gate CG' respectively and a fifth dielectric layers 234 on the outer sidewall of each floating gate FG' respectively. Since the dopant concentration of each control gate CG' is greater than the dopant concentration of each floating gate FG', the thickness of each formed fourth dielectric layer 232 can be larger than the thickness of each first dielectric layer 118 and the thickness of each fifth dielectric layer 234.

As shown in FIG. 11, after the first dielectric layers 218, the second dielectric layer 220, the fourth dielectric layer 232 and the fifth dielectric layers 234 are formed, the third dielectric layer 226 is formed and followed by forming the erase gate EG' and the word lines WL', thereby forming the flash cell structure 200 of this embodiment. The formation of the third dielectric layer 226, the erase gate EG' and the word lines WL' is the same as the first embodiment, and will not be detailed redundantly.

As the above-mentioned, in the present invention, through performing the first implantation process and the second implantation process, the doping concentration of the dopants near the top surface of the semiconductor substrate can be increased, so that the total thickness of the first dielectric layer and the third dielectric layer between the erase gate and the floating gate can be less than the total thickness of the second dielectric layer and the third dielectric layer between the erase gate and the first doped region. Accordingly, when the flash cell structure is in the erase operation, elections in the floating gate can easily tunnel through the first dielectric layer and the third dielectric layer between the erase gate and the floating gate without resulting in the breakdown of the second dielectric layer and the third dielectric layer between the erase gate and the first doped region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash cell structure, comprising:
   a semiconductor substrate;
   a stacked gate structure disposed on the semiconductor substrate, and the stacked gate structure comprising:
      a floating gate insulated from the semiconductor substrate; and
      a control gate disposed on the floating gate and insulated from the floating gate;
   a first doped region disposed in the semiconductor substrate at a side of the stacked gate structure;
   a first dielectric layer disposed on a sidewall of the floating gate;
   a second dielectric layer disposed on the first doped region;
   a third dielectric layer covering the stacked gate structure, the first dielectric layer and the second dielectric layer; and
   an erase gate disposed on the first dielectric layer and the second dielectric layer, wherein a thickness of the first dielectric layer between the erase gate and the floating gate is less than a thickness of the second dielectric layer between the erase gate and the first doped region, and a ratio of a total thickness of the second dielectric layer and the third dielectric layer between the erase gate and the first doped region to a total thickness of the first dielectric layer and the third dielectric layer between the erase gate and the floating gate is substantially from 1.05 to 1.16.

2. The flash cell structure according to claim 1, wherein the first dielectric layer and the second dielectric layer are in contact with each other and are formed of a continuous dielectric layer.

3. The flash cell structure according to claim 1, wherein a doping concentration of the first doped region at a depth of less than 100 nm is greater than $7^{20}$ atoms/$\mu m^3$.

4. The flash cell structure according to claim 1, wherein the first doped region is formed by implanting first dopants at a first doping concentration of $5^{14}$ atoms/$\mu m^3$ and a first energy of 60 keV and implanting second dopants at a second doping concentration of $1.8^{15}$ atoms/$\mu m^3$ and a second energy of 20 keV, and the first dopants are the same as the second dopants.

5. The flash cell structure according to claim 1, wherein a width of the floating gate is greater than a width of the control gate.

6. The flash cell structure according to claim 5, wherein the stacked gate structure comprises a spacer disposed between the erase gate and the control gate.

7. The flash cell structure according to claim 1, further comprising a fourth dielectric layer disposed on the control gate, and a thickness of the fourth dielectric layer being larger than the thickness of the first dielectric layer.

8. The flash cell structure according to claim 1, further comprising a second doped region disposed in the semiconductor substrate and spaced apart from the first doped region, wherein the stacked gate structure is disposed between the first doped region and the second doped region.

9. A method of fabricating a flash cell structure, comprising:
   forming a stacked gate structure on a semiconductor substrate, wherein the stacked gate structure comprises:
      a floating gate insulated from the semiconductor substrate; and
      a control gate disposed on the floating gate and insulated from the floating gate;
   forming a first doped region in the semiconductor substrate at a side of the stacked gate structure and forming a first dielectric layer on a sidewall of the floating gate and a second dielectric layer on the first doped region, wherein a thickness of the first dielectric layer is less than a thickness of the second dielectric layer;
   forming a third dielectric layer to cover the stacked gate structure, the first dielectric layer and the second dielectric layer; and
   forming an erase gate on the third dielectric layer at the side of the stacked gate structure.

10. The method of fabricating the flash cell structure according to claim 9, wherein forming the first doped region comprises performing a first implantation process and a second implantation process.

11. The method of fabricating the flash cell structure according to claim 10, wherein a first doping concentration and a first energy of the first implantation process are respectively $5^{14}$ atoms/$\mu m^3$ and 60 keV, and a second doping concentration and a second energy of the second implantation process are respectively $1.8^{15}$ atoms/$\mu m^3$ and 20 keV.

12. The method of fabricating the flash cell structure according to claim 11, wherein the second implantation process is performed after the first implantation process.

13. The method of fabricating the flash cell structure according to claim 11, wherein first dopants of the first implantation process and second dopants of the second implantation process comprise arsenic.

14. The method of fabricating the flash cell structure according to claim 10, wherein forming the first doped region further comprises performing a drive-in process after the first implantation process and the second implantation process.

15. The method of fabricating the flash cell structure according to claim 9, wherein the first dielectric layer and the second dielectric layer are formed by performing a pretreatment process introducing nitrogen oxide.

16. The method of fabricating the flash cell structure according to claim 9, wherein forming the first dielectric layer and the second dielectric layer further comprises forming a fourth dielectric layer on the control gate, and a thickness of the fourth dielectric layer being larger than the thickness of the first dielectric layer.

17. The method of fabricating the flash cell structure according to claim 9, wherein forming the erase gate further comprises forming a word line on the semiconductor substrate at another side of the stacked gate structure.

18. The method of fabricating the flash cell structure according to claim 17, further comprising forming a second doped region in the semiconductor substrate, wherein the second doped region is spaced apart from the first doped region, and the word line and the stacked gate structure are disposed between the first doped region and the second doped region.

* * * * *